United States Patent
Goto

(10) Patent No.: US 10,290,499 B2
(45) Date of Patent: May 14, 2019

(54) SUBSTRATE PROCESSING APPARATUS AND SUBSTRATE PROCESSING METHOD

(71) Applicant: Toshiba Memory Corporation, Minato-ku (JP)

(72) Inventor: Tomohiro Goto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 209 days.

(21) Appl. No.: 15/194,809

(22) Filed: Jun. 28, 2016

(65) Prior Publication Data

US 2017/0213721 A1  Jul. 27, 2017

(30) Foreign Application Priority Data

Jan. 26, 2016  (JP) ................... 2016-012384

(51) Int. Cl.
*H01L 21/00* (2006.01)
*H01L 21/027* (2006.01)
*B05B 1/30* (2006.01)
*H01L 21/67* (2006.01)

(52) U.S. Cl.
CPC ............ *H01L 21/0271* (2013.01); *B05B 1/30* (2013.01); *H01L 21/67109* (2013.01)

(58) Field of Classification Search
CPC .. H01L 21/0271; H01L 21/67109; B05B 1/30
See application file for complete search history.

(56) References Cited

U.S. PATENT DOCUMENTS

| 5,695,817 A | 12/1997 | Tateyama et al. |
| 2011/0045195 A1* | 2/2011 | Yoshihara ............... G03F 7/162 427/421.1 |

FOREIGN PATENT DOCUMENTS

| JP | 8-281184 | 10/1996 |
| JP | 8-321449 A | 12/1996 |
| JP | 9-293659 A | 11/1997 |
| JP | 2001-203151 | 7/2001 |
| JP | 2008-12377 A | 1/2008 |
| JP | 2008-307708 A | 12/2008 |
| JP | 2012-235132 | 11/2012 |

* cited by examiner

*Primary Examiner* — Mounir S Amer
*Assistant Examiner* — Alexander Belousov
(74) *Attorney, Agent, or Firm* — Oblon, McClelland, Maier & Neustadt, L.L.P.

(57) ABSTRACT

According to one embodiment, a substrate processing apparatus includes a nozzle and a control device. The nozzle dispenses a chemical solution onto a substrate. The control device controls a mechanism which promotes evaporation of a solvent contained in the chemical solution remaining in the nozzle to form a solidified layer in the nozzle. The solidified layer is obtained by solidifying components contained in the remaining chemical solution.

17 Claims, 8 Drawing Sheets

SUBSTRATE PROCESSING APPARATUS AND SUBSTRATE PROCESSING METHOD

CROSS-REFERENCE TO RELATED APPLICATIONS

This application is based upon and claims the benefit of priority front Japanese Patent Application No. 2016-12384, filed on Jan. 26, 2016; the entire contents of which are incorporated herein by reference.

FIELD

Embodiments described herein relate generally to a substrate processing apparatus and a substrate processing method.

BACKGROUND

As a substrate processing apparatus, there is known an apparatus which coats a chemical solution dispensed through a nozzle onto a substrate. While dispensing the chemical solution through the nozzle is stopped, solidified objects of components contained in the chemical solution may occur in the nozzle because the solvent contained in the chemical solution remaining in the nozzle evaporates. If these solidified objects are dispensed onto a substrate, a chemical-solution coating failure or defects in the processed substrate occur, resulting in a decrease in the productivity of the substrate processing apparatus. If the chemical solution is periodically dispensed through the nozzle in order to prevent solidified objects from occurring, the amount of the discarded chemical solution increases.

DETAILED DESCRIPTION

In general, according to one embodiment, a substrate processing apparatus includes a nozzle and a control device. The nozzle dispenses a chemical solution onto a substrate. The control device controls a mechanism which promotes evaporation of a solvent contained in the chemical solution remaining in the nozzle to form a solidified layer in the nozzle. The solidified layer is obtained by solidifying components contained in the remaining chemical solution.

Exemplary embodiments of a substrate processing apparatus and a substrate processing method will be explained below in detail with reference to the accompanying drawings. The present invention is not limited to the following embodiments.

First Embodiment

Figure 1:
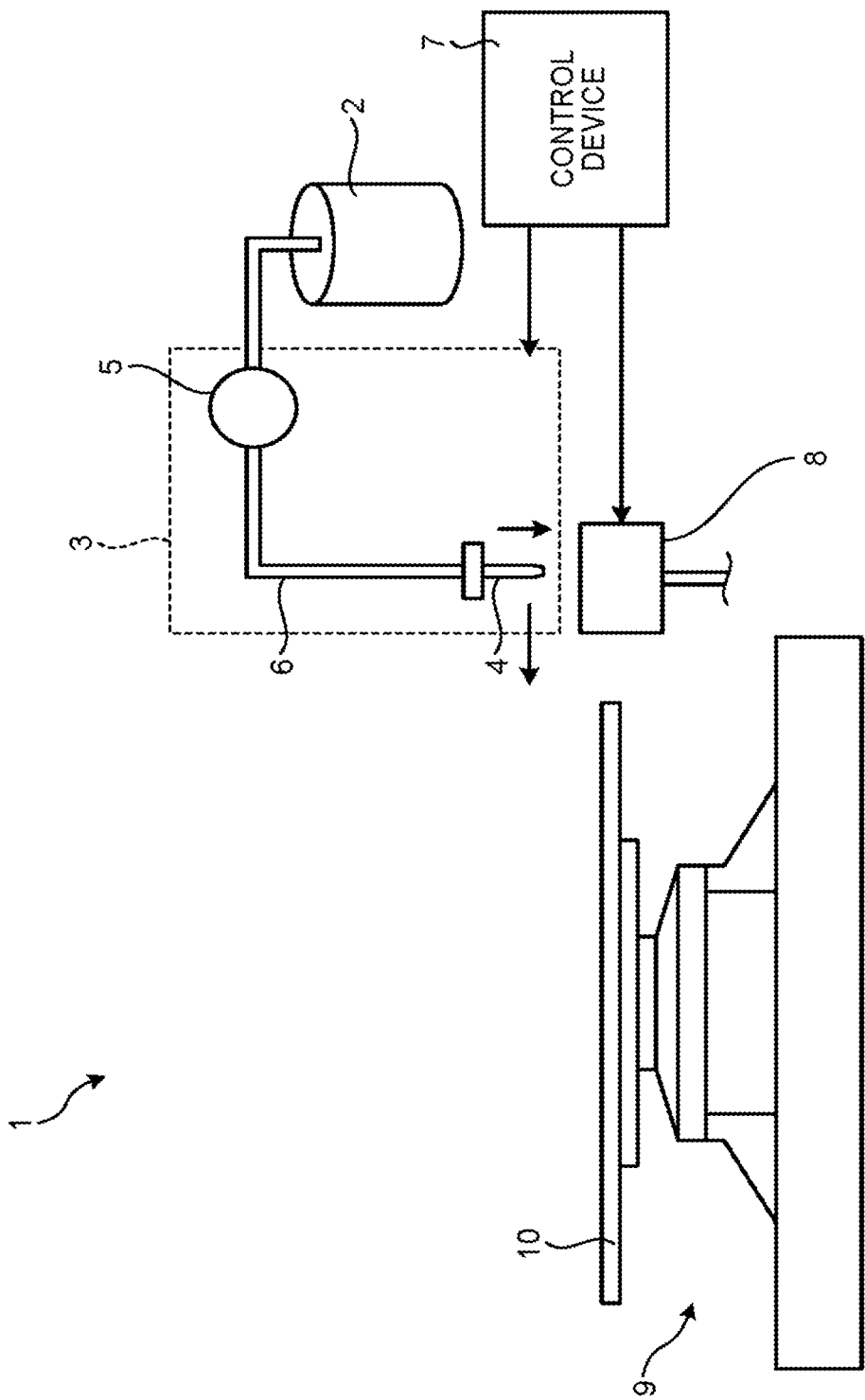
FIG. 1 is a diagram showing schematically the configuration of a semiconductor manufacturing apparatus that is a substrate processing apparatus of a first embodiment.

FIG. 1 is a diagram showing schematically the configuration of a semiconductor manufacturing apparatus that is a substrate processing apparatus of the first embodiment. The semiconductor manufacturing apparatus 1 coats a resist solution that is a chemical solution onto a substrate 10. The substrate 10 is, for example, a semiconductor wafer.

The semiconductor manufacturing apparatus 1 includes a dispensing unit 3, a control device 7, a container 8, and a substrate holding unit 9. The substrate holding unit 9 holds the substrate 10 to be horizontal. The substrate holding unit 9 rotates the held substrate 10 in a horizontal plane.

The dispensing nit 3 includes a nozzle 4, a pump 5, and a pipe 6. The dispensing unit 3 sends the resist solution stored in a tank 2 to the nozzle 4 by driving the pump 5. The nozzle 4 dispenses the resist solution sent through the pipe 6.

The dispensing unit 3 includes a moving means (not shown) that moves the nozzle 4 in vertical directions and horizontal directions. The moving means moves the nozzle 4 between a supplying position that is a first position and a waiting position that is a second position. The supplying position is a position over the substrate 10 held by the substrate holding unit 9. The dispensing unit 3 moves the nozzle 4 to the supplying position to supply the resist solution onto the substrate 10.

The waiting position is a position in which the nozzle 4 is made to wait before and after supplying the resist solution onto the substrate 10 and is near the substrate holding unit 9. The state of the dispensing unit 3 where the nozzle 4 is made to wait in the waiting position, is called a wait state as needed.

The semiconductor manufacturing apparatus 1 supplies the resist solution through the nozzle 4 onto e substrate 10 being rotated by the substrate holding unit 9, thereby forming a resist film over the surface of the substrate 10. Note that the semiconductor manufacturing apparatus 1 is not limited to one which rotates the substrate in by the substrate holding unit 9. The semiconductor manufacturing apparatus 1 may be one which supplies a resist solution onto the substrate 10 while moving the nozzle 4 over the substrate 10.

The control device 7 controls the operation of the entire semiconductor manufacturing apparatus 1. The container 8 is placed at the waiting position. The semiconductor manufacturing apparatus 1 inserts the tip of the nozzle 4 into the container 8 while the dispensing unit 3 is in the wait state.

Figure 2:
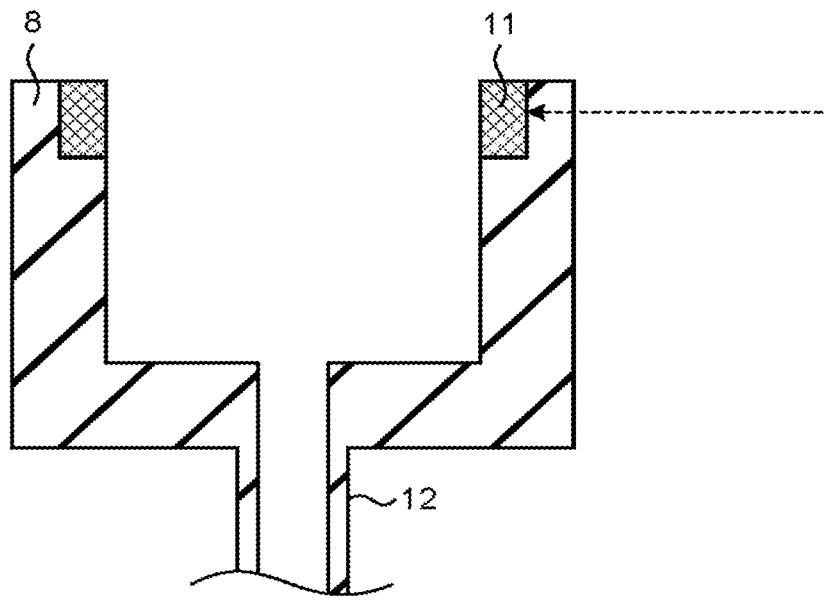
FIG. 2 is a cross-sectional view showing schematically the configuration of the container shown in FIG. 1.

FIG. 2 is a cross-sectional view showing schematically the configuration of the container 8. The container 8 is a box-shaped structure having an opening in its top. The tip of the nozzle 4 is inserted into the space inside the container 8 through the opening. The container 8 is formed of, e.g., resin material. The container 8 may be formed of any material resistant to chemical solutions.

A drain pipe 12 is connected to the bottom of the container 8. The drain pipe 12 drains the resist solution, dispensed through the nozzle 4 into the container 8, out of the container 8.

A heater 11 is provided at the opening of the container 8. The heater 11 has a heating wire that generates heat when current flows through it. Heat from the heater 11 is supplied to the nozzle 4 inserted in the container 8. The heater 11 forms a mechanism to promote the evaporation of the solvent contained in the resist solution remaining in the nozzle 4.

In the first embodiment, the heater 11 raises the temperature of the solvent contained in the resist solution, thereby promoting the evaporation of the solvent. The heater 11 may have any configuration that generates heat, not being limited to one having a heating wire.

Figure 3:
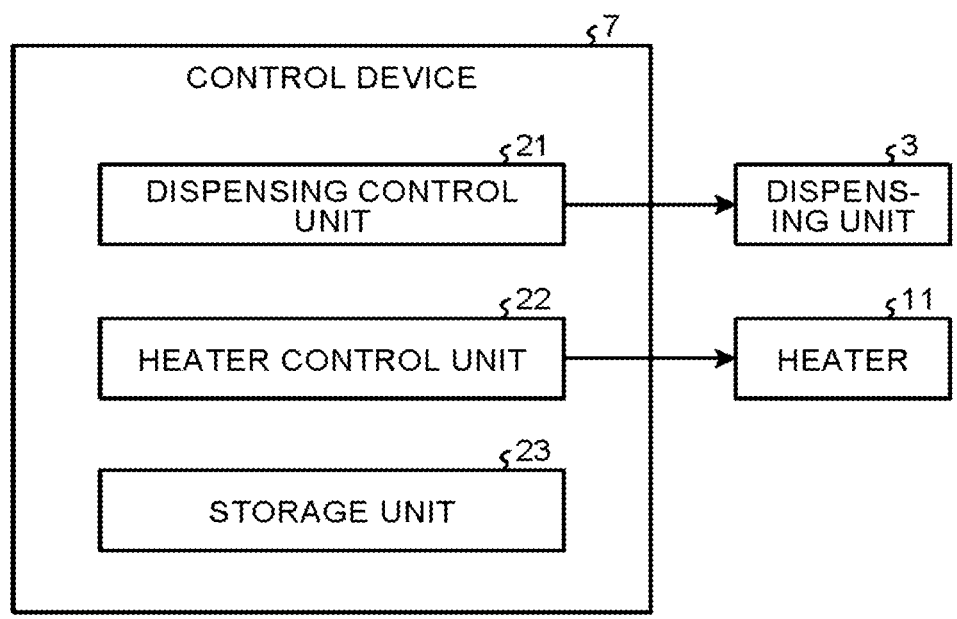
FIG. 3 is a diagram showing the function blocks of the control device shown in FIG. 1.

FIG. 3 is a diagram showing the function blocks of the control device 7. In FIG. 3, the configuration of parts, for controlling the dispensing unit 3 and heater 11, of the control device 7 is shown with diagrammatic representation and description of the other being omitted.

The control device 7 is hardware in which is installed a program to realize a substrate processing method performed by the substrate processing apparatus of the present embodiment. The functions that the program has are realized using a computer that is hardware. FIG. 3 shows function units realized using a hardware configuration described later.

The control device 7 includes a dispensing control unit 21, a heater control unit 22, and a storage unit 23. The dispensing control unit 21 controls the operation of the dispensing unit 3. The dispensing unit 3 moves the nozzle 4 and dispenses the resist solution according to a control signal from the dispensing control unit 21.

The heater control unit 22 controls the operation of the heater 11. The heater 11 generates heat according to a control signal front the heater control unit 22. The broken-line arrow shown in FIG. 2 indicates the control signal inputted from the control device 7 to the heater 11. The storage unit 23 stores a variety of information about the operation of the dispensing unit 3 and the operation of the heater 11.

The semiconductor manufacturing apparatus 1 forms a solidified layer in the nozzle 4 while having the nozzle 4 wait in the waiting position. The solidified layer is formed by solidifying components contained in the resist solution remaining in the nozzle 4. The semiconductor manufacturing apparatus 1 has the heater 11 operate according to control by the heater control unit 22, thereby intentionally forming the solidified layer having a desired thickness. When resuming supplying the resist solution onto a substrate 10, the semiconductor manufacturing apparatus removes the solidified layer from the nozzle 4 in the waiting position and then moves the nozzle 4 to the supplying position.

Figure 4:
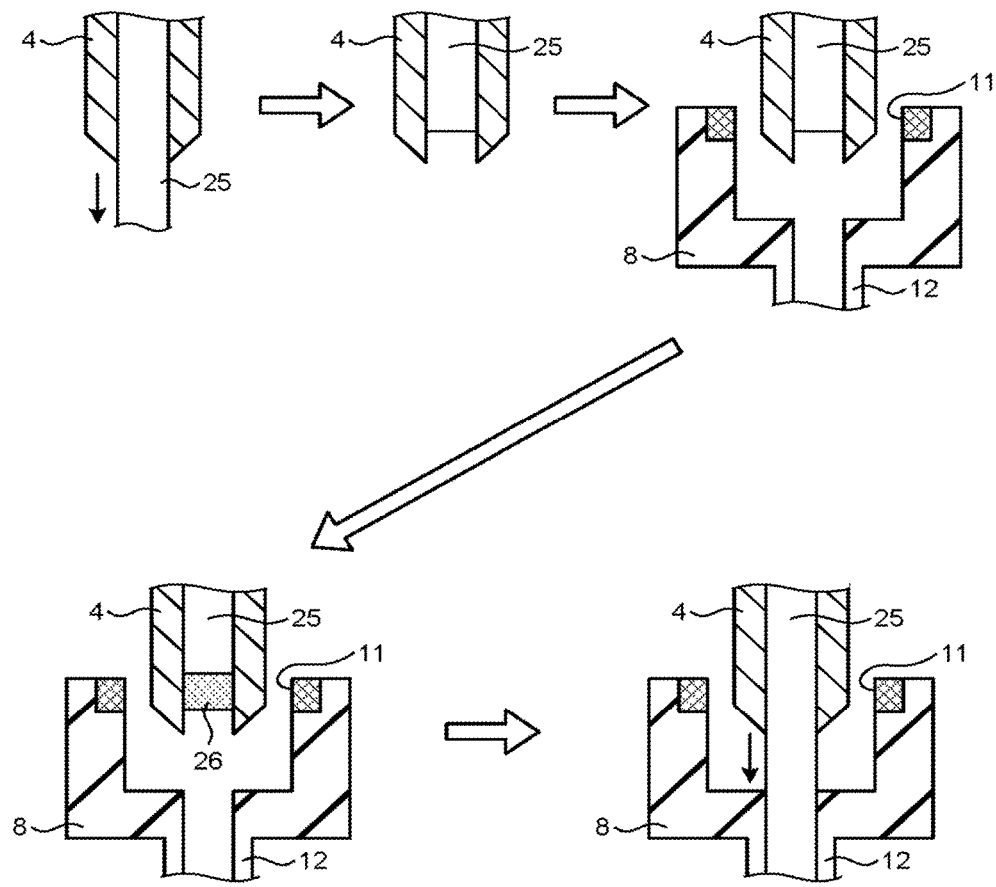
FIG. 4 is a diagram for explaining the dispensing of a chemical solution and the forming of a solidified layer in the nozzle shown in FIG. 1.

FIG. 4 is a diagram for explaining the dispensing of the chemical solution and the forming of the solidified layer in the nozzle 4. FIG. 4 shows cross-sections of the nozzle 4 or the nozzle 4 and the container 8 in five stages. In the first stage shown in the upper left part of FIG. 4, the nozzle 4 in the supplying position dispenses the resist solution 25 onto the substrate 10.

In the second stage subsequent to the first stage, the dispensing unit 3 finishes dispensing the resist solution 25 through the nozzle 4. When dispensing the resist solution 25 finishes, the nozzle 4 moves from the supplying position to the waiting position. The tip of the nozzle 4 is inserted into the container 8. The resist solution 25 remains inside the nozzle 4.

In the third stage where the nozzle 4 has been moved to the waiting position, the heater 11 starts generating heat. The heat generated by the heater 11 is supplied to the vicinity of the tip of the nozzle 4. Supplying heat to the nozzle 4 raises the temperature of the resist solution 25 remaining in the nozzle 4, so that the evaporation of the solvent contained in the resist solution 25 is promoted at the interface on the dispensing side of the resist solution 25. At this interface, the solidification of resin components contained in the resist solution 25 progresses.

The temperature of the heater 11 at the time of operation is set at a value of from, e.g., 50° C. to 200° C. The temperature of the heater 11 can be set as needed according to the boiling point of the solvent contained in the resist solution 25.

In the fourth stage after a predetermined set time elapses from the start of supplying heat, the heater 11 stops supplying heat. In the lower left part of FIG. 4 are shown the nozzle 4 and the container 6 in the fourth stage. Because of supplying heat for the set time, a solidified layer 26 having a predetermined thickness is formed inside the nozzle 4.

The semiconductor manufacturing apparatus 1 has the nozzle 4 wait in the waiting position while the operation of the heater 11 is stopped. Stopping the operation of the heater 11 causes the solidified layer 26 to maintain its thickness that it had when supplying heat was stopped.

Because the resist solution 25 remaining in the nozzle 4 is separated by the solidified layer 26 from air, the evaporation of the solvent through the nozzle 4 is suppressed. Thus, the solidification of more of resin components inside the nozzle 4 is reduced. Further, the concentration of resin components in the resist solution 25 remaining in the nozzle 4 is maintained. The semiconductor manufacturing apparatus 1 can suppress the occurrence of solidified objects except the solidified layer 26 during the time that the nozzle 4 is made to wait.

In the fifth stage subsequent to the fourth stage, before moving the nozzle 4 front the waiting position to the supplying position when the nozzle 4 waiting ends, the dispensing unit 3 at the waiting position preliminarily dispenses the resist solution 25. The solidified layer 26 receives dispensing pressure of the resist solution 25 in the nozzle 4 to be detached from the nozzle 4. The solidified layer 26 detached from the nozzle 4 falls into the container 8 together with the resist solution 25 dispensed through the nozzle 4. The solidified layer 26 and the dispensed resist solution 25 are drained out of the container 8 into the drain pipe 12.

After the preliminary dispensing of the resist solution 25 finishes in the fifth stage, the dispensing unit 3 moves the nozzle 4 to the supplying position. The dispensing unit 3 starts dispensing the resist solution 25 onto the substrate 10 through the nozzle 4. The semiconductor manufacturing apparatus repeats the operation of the dispensing unit 3 and the heater 11 in the first to fifth stages.

The thickness of the solidified layer 6 formed in the nozzle 4 need only be such that the solidified layer 26 can be easily detached by applying predetermined dispensing pressure of the resist solution 25. The predetermined dispensing pressure is, for example, 0.2 to 0.4 MPa (megapascals). The set time for which the heater 11 is made to operate is the time required form the solidified layer 26 of such a thickness.

The set time may be determined by any method such as performing a test to actually form the solidified layer 26 or performing a simulation of the formation of the solidified layer 26. The control device 7 sets the temperature of the heater 11 and the set time based on data inputted by, e.g., operation of a user.

If the nozzle 4 is left in the waiting position without making the heater 11 operate, the solvent naturally evaporates from the resist solution 25. The solidification of resin components slowly progresses from part near the inner wall surface of the nozzle 4 of the interface area of the resist solution 25. In this case, a gel-like mixing layer in which solidified components and liquid components are mixed is formed at the interface.

This mixing layer is not uniform in at least either degree of solidification or thickness and hence is difficult to remove sufficiently by the preliminary dispensing of the resist solution 25 at the waiting position. Even after the mixing layer is formed, the evaporation of the solvent continues, so that the liquid surface of the resist solution 25 gradually retreats. As the liquid surface of the resist solution 25 is retreating, remaining solidified objects are sticking to the inner wall surface of the nozzle 4. Thus, if the nozzle 4 is simply left in the waiting position, solidified objects remaining in the nozzle 4 increase in number, so that the cleanliness of the nozzle 4 remarkably decreases.

In contrast, in the semiconductor manufacturing apparatus 1 of the present embodiment, the heater 11 is provided at the waiting position to control heat supply to the nozzle 4, so that the solidified layer 26 of a desired uniform thickness can be formed in a short time. In the semiconductor manufacturing apparatus 1, the solidified layer 26 can be easily detached by the preliminary dispensing of the resist solution 25 at the waiting position.

In the semiconductor manufacturing apparatus 1, while the nozzle 4 is made to wait in the waiting position, the occurrence of solidified objects except the solidified layer 26 is suppressed. The semiconductor manufacturing apparatus 1 forms the solidified layer 26, which can be easily detached, suppressing the occurrence of the other solidified objects, and thus can increase the cleanliness of the nozzle 4 at the time of resuming the dispensing of the resist solution 25 onto a substrate 10.

The semiconductor manufacturing apparatus 1 can reduce failures in coating the resist solution 25 onto the substrate 10 by reducing solidified objects brought onto the substrate 10. The semiconductor manufacturing apparatus 1 can reduce defects on the processed substrate 10 in number by reducing contamination of the substrate 10 by solidified objects that are impurities. Thus, the semiconductor manufacturing apparatus 1 can improve product yields to secure high productivity.

The semiconductor manufacturing apparatus 1 can greatly reduce the amount of the discarded resist solution 25 as compared with the case where the resist solution 25 is periodically dispensed at the waiting position to suppress the formation of solidified objects in the nozzle 4. Thus, the semiconductor manufacturing apparatus 1 can reduce the cost of processing the substrate 10.

Figure 5:
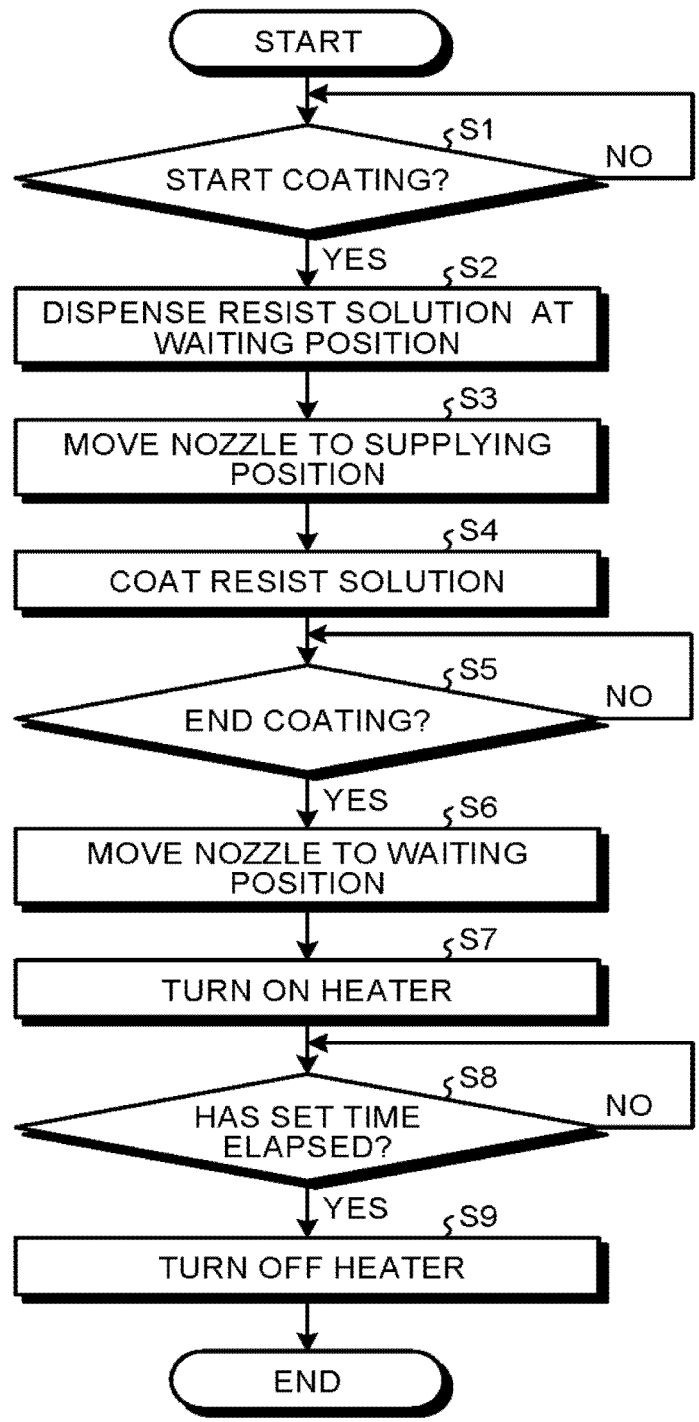
FIG. 5 is a flow chart for explaining the operation procedure of the semiconductor manufacturing apparatus shown in FIG. 1.

FIG. 5 is a flow chart for explaining the operation procedure of the semiconductor manufacturing apparatus 1. The operation procedure starts with the dispensing unit 3 being in the wait state. The nozzle 4 and the container 8 are in the state of the fourth stage described with reference to FIG. 4. The solidified layer 26 is formed inside the nozzle 4. The heater 11 is made to stop operating.

The dispensing control unit 21 determines whether it is instructed to start coating the resist solution 25 onto the substrate 10 (step S1). If there is no instruction to start coating (No at step S1), the dispensing unit 3 keeps in the wait state.

When it is instructed to start coating (Yes at step S1), the dispensing control unit 21 instructs the dispensing unit 3 to preliminarily dispensing the resist solution 25 at the waiting position. The dispensing unit 3 has the pump 5 operate to dispense the resist solution 25 through the nozzle 4 into the container 6 (step S2). The dispensing unit 3 detaches the solidified layer 26 using dispensing pressure of the resist solution 25 in the nozzle 4. At this time, the nozzle 4 and the container 8 are in the state of the fifth stage described previously.

After dispensing the resist solution 25 at step S2 finishes, the dispensing control unit 21 instructs the dispensing unit 3 to move the nozzle 4 from the waiting position to the supplying position. The dispensing unit 3 moves the nozzle 4 to the supplying position by driving a moving means (step S3).

After moving the nozzle 4 to the supplying position finishes, the dispensing control unit 21 instructs the dispensing unit 3 to dispense the resist solution 25. The semiconductor manufacturing apparatus 1 has the pump 5 operate to dispense the resist solution 25 through the nozzle 4 so as to coat the resist solution 25 onto the substrate 10 (step S4). The nozzle 4 is in the state of the first stage described previously.

The dispensing control unit 21 determines whether it is instructed to end coating the resist solution 25 onto the substrate 10 (step S5). If there is no instruction to end coating (No at step S5), the semiconductor manufacturing apparatus 1 continues coating the resist solution 25 at step S4.

When it is instructed to end coating (Yes at step S5), the dispensing control unit 21 has the dispensing unit 3 stop dispensing the resist solution 25. The nozzle 4 is in the state of the second stage described previously. After having it stop dispensing the resist solution 25, the dispensing control unit 21 instructs the dispensing unit 3 to move the nozzle 4 from the supplying position to the waiting position. The dispensing unit 3 moves the nozzle 4 to the waiting position by driving a moving means (step S6). The moving means inserts the tip of the nozzle 4 into the container 8.

After moving the nozzle 4 to the waiting position finishes, the heater control unit 22 instructs the heater 11 to start operating. The heater 11 is put in an ON state for current to flow through the heating wire so as to start generating heat (step S7). The nozzle 4 and the container 8 are in the state of the third stage described previously.

The heater control unit 22 determines whether a set time has elapsed since the heater 11 started operating (step S8). The heater control unit 22, for example, acquires the count value of a counter (not shown) counting up each unit time and determines whether the count value counted since the heater 11 started operating exceeds a predetermined value indicating the set time. If the set time has not elapsed (No at step S8), the heater control unit 22 makes the heater 11 continue generating heat.

If the set time has elapsed (Yes at step S8), the heater control unit 22 instructs the heater 11 to end operating. The heater 11 is put in an OFF state to stop current through the heating wire so as to end generating heat (step S9). The nozzle 4 and the container 8 are made to return to the state of the fourth stage, with which the operation procedure starts. By this means, the semiconductor manufacturing apparatus 1 finishes a series of operations including coating the resist solution 25 onto the substrate 10. The semiconductor manufacturing apparatus 1 keeps the dispensing unit 3 in the wait state until it is next instructed to start coating.

Here, the advantages of the present embodiment will be described, in which description the viscosities of chemical solutions generally used in substrate processing are roughly classified into low viscosity, middle viscosity, and high viscosity. Let the low viscosity be less than 100 cP (centipoise). Let the high viscosity be higher than 1000 cP. Let the middle viscosity be between the low viscosity and the high viscosity, no less than 100 cP and no higher than 1000 cP. For example, as the concentration of resin components contained in the chemical solution becomes higher, the viscosity of the chemical solution becomes higher.

In these years, in the manufacture of semiconductor devices, the umber of layers stacked on the substrate is increasing. In order to form a film of such a thickness as to be able to cover high structures on the substrate, the viscosity of chemical solutions to be used may be raised.

Conventionally, there is known a method which suppresses the evaporation of the solvent from the chemical solution remaining in the nozzle 4 by filling the container 8 at the waiting position with vaporized solvent. With this method, it may be difficult to suppress the solidification of chemical solutions of middle viscosity or above.

Further, conventionally, there is known a method which suppresses the evaporation of the solvent from the chemical solution in the nozzle 4 by introducing a solvent layer between the chemical solution remaining in the nozzle 4 and air. In the introduced solvent layer, the dissolving of resin components contained in the chemical solution progresses. If the nozzle 4 is left in this state, resin components gather below in the solvent layer because of the difference in specific gravity between the resin components and the solvent. With this method, for chemical solutions of middle viscosity or above, the solidification of the resin components below in the solvent layer becomes remarkable, so that it may be difficult to suppress the solidification.

In contrast, the present embodiment adopts the method which forms the solidified layer 26 of a desired uniform thickness in a short time so as to separate the chemical solution remaining in the nozzle 4 from air by the solidified layer 26. With the method of the present embodiment, also for chemical solutions of middle viscosity or above, the occurrence of solidified objects except the solidified layer 26 can be sufficiently suppressed. The method of the present embodiment is appropriate for cases where the viscosity of the chemical solution is middle viscosity or above.

Figure 6:
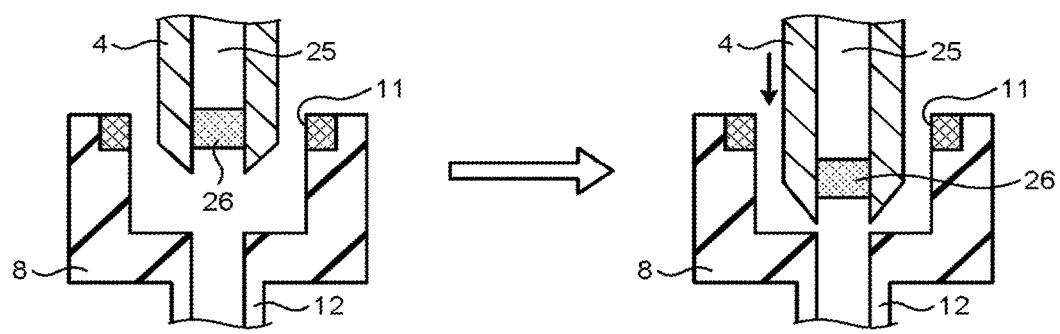
FIG. 6 is a diagram for explaining the operation procedure where a heater is made to operate before the preliminary dispensing of the chemical solution through the nozzle shown in FIG. 1.

The semiconductor manufacturing apparatus 1 may make the heater 11 operate before the preliminary dispensing of the chemical solution for detaching the solidified layer 26. FIG. 6 is a diagram for explaining the operation procedure where the heater 11 is made to operate before the preliminary dispensing of the chemical solution through the nozzle 4.

The nozzle 4 and the container 8 in the above fourth stage are shown in the left part of FIG. 6. At this time, the solidified layer 26 is located at a position almost the same height in the nozzle 4 as the heater 11. If it is instructed to start coating while the dispensing unit 3 is in the wait state, the dispensing control unit 21 instructs tree dispensing unit 3 to move the nozzle 4 to a lower position. The dispensing unit 3 moves the nozzle 4 down in the container 8 by driving the moving means. The dispensing unit 3 moves the nozzle 4 to align the top of the solidified layer 26 in the nozzle 4 level with the height at which the heater 11 is located as shown in the right part of FIG. 6.

The heater control unit 22 instructs the heater 11 to start operating. The heater 11 tarts generating heat. The heat from the heater 11 raises the temperature of the solvent contained in the resist solution 25 so as to promote the solidified layer 26 dissolving in the solvent contained in the resist solution 25.

The heater 11 stops operating after a predetermined time elapses. Then the dispersing control unit 21 instructs the dispensing unit 3 to preliminarily dispensing the resist solution 25. The semiconductor manufacturing apparatus 1 can further easily detach the solidified layer 26 by making the heater 11 operate before the preliminary dispensing of the resist solution 25.

Figure 7:
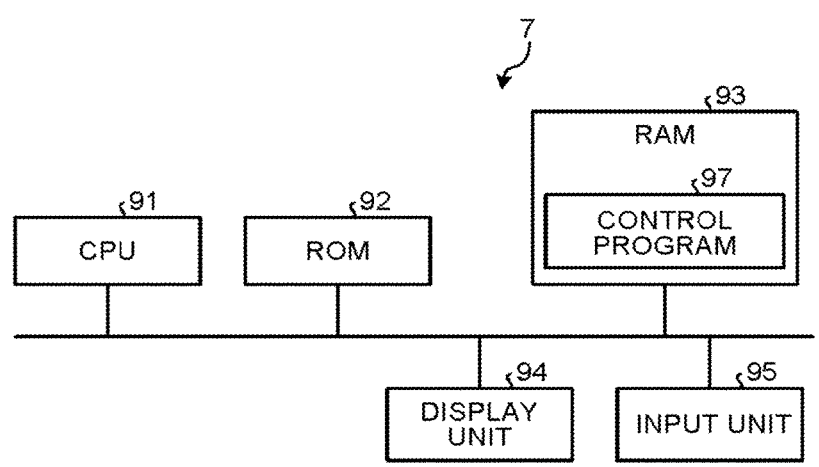
FIG. 7 is a block diagram showing the hardware configuration of the control device shown in FIG. 1.

FIG. 7 is a block diagram showing the hardware configuration of the control device 7. The control device 7 includes a CPU (Central Processing Unit) 91, a ROM (Read Only Memory) 92, a R (Random Access Memory) 93, a display unit 94, and an input unit 95. The CPU 91, ROM 92, RAM 93, display unit 94, and input unit 95 are connected via a bus to be able to communicate with each other.

A control program 97 that is a computer program is stored in the ROM 92 and loaded into the RAM 93 via the bus. FIG. 7 shows the state where the control program 97 is loaded into the RAM 93. The control program 97 includes instructions to control the operation of the dispensing unit 3 and the heater 11.

The CPU 91 expands the control program 97 in a program storage area in the RAM 3 to perform various processes. A data storage area in the RAM 93 is used as a work memory in performing various processes. The display unit 94 is, for example, a liquid crystal display. The input unit 95 is a keyboard, a pointing device, and the like that accept input operation to the control device 7.

The temperature of the heater 11 and the set time for which the heater 11 is made to operate are inputted to the input unit 95 by a user's input operation. The CPU 91 controls the operation of the heater 11 according to data inputted to the input unit 95. The display unit 94 displays information about the operation of the semiconductor manufacturing apparatus 1. The display unit 94 may display data about the temperature and set time of the heater 11 inputted to the input unit 95.

The chemical solution to which the embodiment is applied is not limited to the resist solution 25. The chemical solution may be any solution in which the solvent contained evaporates causing the solidification to progress. The chemical solution may be, for example, an adhesive or the like.

The substrate processing apparatus may be any apparatus which coats a chemical solution onto a to-be-processed substrate other than a semiconductor wafer, not being limited to the semiconductor manufacturing apparatus 1 that coats a chemical solution onto the substrate 10 that is a semiconductor wafer. The substrate processing apparatus may be, for example, an apparatus which coats a chemical solution onto a liquid crystal substrate.

According to the first embodiment, the semiconductor manufacturing apparatus 1 stops dispensing the chemical solution to form the solidified layer 26 at the interface on the dispensing side of the chemical solution remaining in the nozzle 4. The control device 7 forms the solidified layer 26 of a desired uniform thickness by making the heater 11 operate for a predetermined set time. The semiconductor manufacturing apparatus can reduce contamination of the substrate 10 by solidified objects by raising the cleanliness of the nozzle 4 at the time of resuming the dispensing of the chemical solution onto a substrate 10, so as to improve product yields. The semiconductor manufacturing apparatus 1 can reduce the amount of the chemical solution discarded at the waiting position. As such, the effect of being able to realize high productivity and efficient use of the chemical solution is produced.

Second Embodiment

Figure 8:
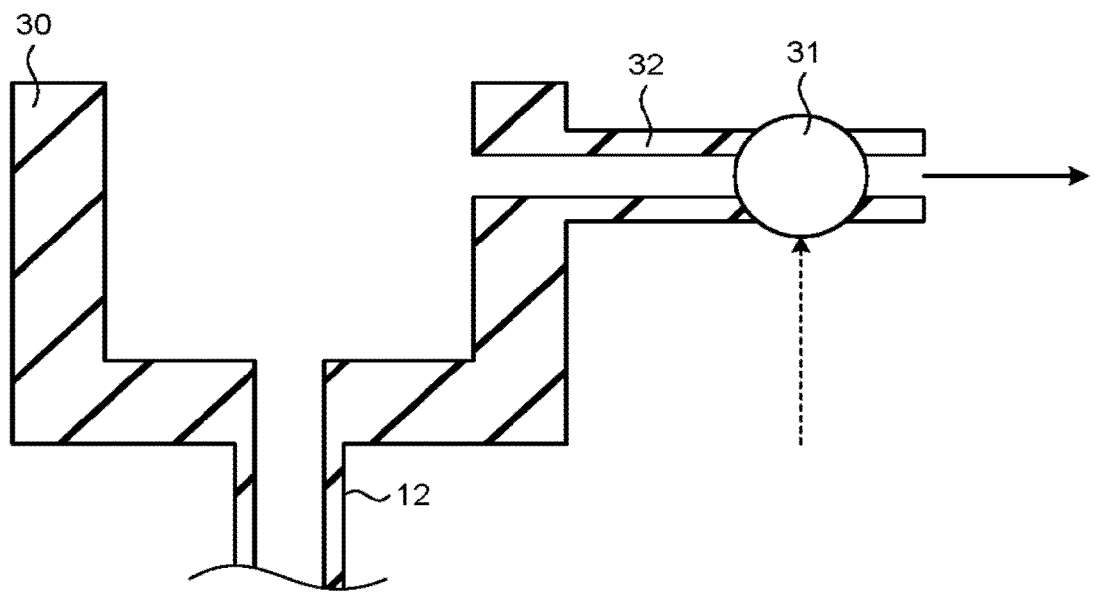
FIG. 8 is a cross-sectional view showing schematically the configuration of a container provided in a semiconductor manufacturing apparatus that is a substrate processing apparatus of a second embodiment.

FIG. 8 is a cross-sectional view showing schematically the configuration of a container provided in semiconductor manufacturing apparatus that is a substrate processing apparatus of the second embodiment. The same reference numerals are used to denote the same parts as in the first embodiment, and duplicate description thereof is omitted as needed. The container 30 is provided in the semiconductor manufacturing apparatus 1 instead of the container B of the first embodiment. The container 30 is placed at the waiting position.

An exhaust pipe 32 is provided at a side of the container 30. The exhaust pipe 32 is provided near the opening of the container 30. A gas expelling unit that is an air-current generating unit, expels gas in the container 30 through the exhaust pipe 32, thereby generating air current around the tip of the nozzle 4 inserted into the container 30. The gas expelling unit 31 includes, for example, a pump. The pump sucks gas from the side of the exhaust pipe 32 connected to the container 30 to expel the gas out of the container 30.

The gas expelling unit 31 forms a mechanism that promotes the evaporation of the solvent contained in the resist solution remaining in the nozzle 4. In the second embodiment, the gas expelling unit 31 makes the solvent, having evaporated from the resist solution to stay near the interface of the resist solution, flow out of the container 30 so as to promote the evaporation of the solvent.

Figure 9:
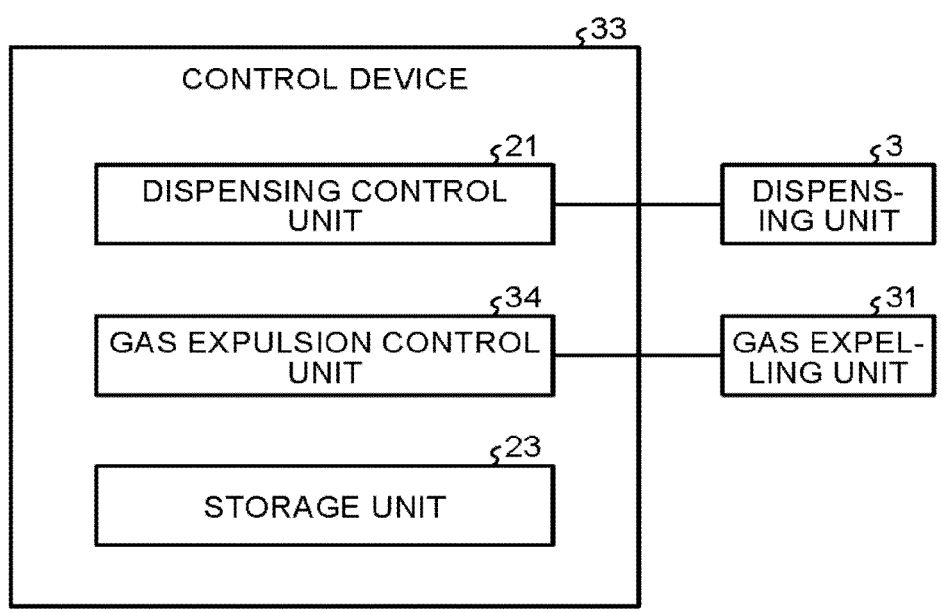
FIG. 9 is a diagram showing the function blocks of a control device provided in the semiconductor manufacturing apparatus of the second embodiment.

FIG. 9 is a diagram showing the function blocks of the control device 33 provided in the semiconductor manufacturing apparatus 1. Instead of the control device 7 of the first embodiment, the control device 33 is provided in the semiconductor manufacturing apparatus 1. FIG. 9 shows the configuration of parts, for controlling the dispensing unit 3 and the gas expelling unit 31, of the control device 33, with diagrammatic representation and description of the other being omitted. FIG. 9 shows function units realized using a hardware configuration like FIG. 3.

The control device 33 includes the dispensing control unit 21, the storage unit 23, and a gas expulsion control unit 34. The gas expulsion control unit 34 controls the operation of the gas expelling unit 31. The gas expelling unit 31 operates according to a control signal from the gas expulsion control unit 34. The broken-line arrow shown in FIG. 8 indicates the control signal inputted from the control device 33 to the gas expelling unit 31. The storage unit 23 stores a variety of information about the operation of the dispensing unit 3 and the operation of the gas expelling unit 31.

The semiconductor manufacturing apparatus 1 intentionally forms a solidified layer of a desired thickness by making the gas expelling unit 31 operate according to control by the gas expulsion control unit 34.

Figure 10:
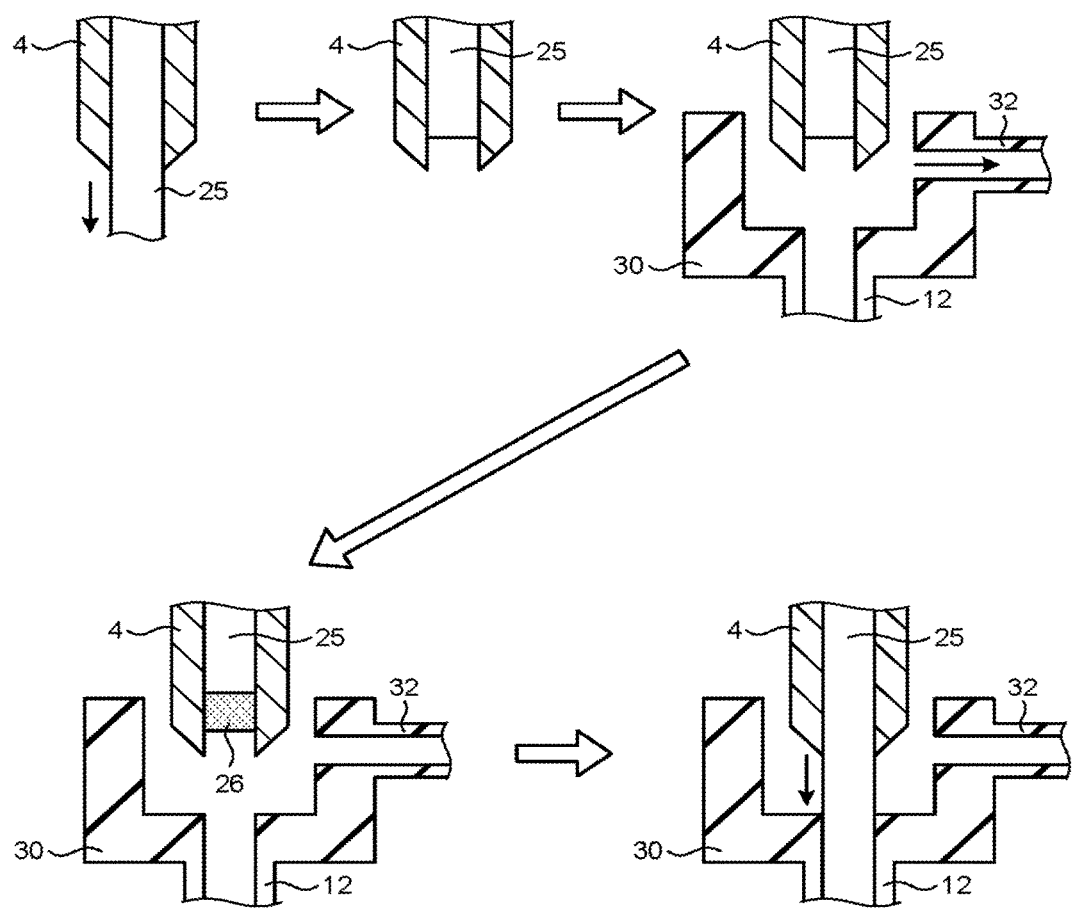
FIG. 10 is a diagram for explaining the dispensing of a chemical solution and the forming of a solidified layer in a nozzle provided in the semiconductor manufacturing apparatus of the second embodiment.

FIG. 10 is a diagram for explaining the dispensing of the chemical solution and the forming of the solidified layer in the nozzle 4. FIG. 10 shows cross-sections of the nozzle 4 or the nozzle 4 and the container 30 in five stages. In the first stage shown in the upper left part of FIG. 10, the nozzle 4 in the supplying position dispenses the resist solution 25 onto the substrate 10.

In the second stage, the dispensing unit 3 finishes dispensing the resist solution 25 through the nozzle 4. When dispensing the resist solution 25 finishes, the nozzle 4 moves from the supplying position to the waiting position. The tip of the nozzle 4 is inserted into the container 30. The resist solution 25 remains inside the nozzle 4. Gas of the solvent, having evaporated from the resist solution 25, occurs near the interface with air of the resist solution 25 remaining in the nozzle 4.

In the third stage where the nozzle 4 has been moved to the waiting position, the gas expelling unit 31 starts expelling gas. The gas of the solvent occurring near the interface of the resist solution 25, together with air in the container 30, is expelled into the exhaust pipe 32. The container 30 is not hermetically closed while the tip of the nozzle 4 is inserted. Thus, air current flowing from the nozzle 4 into the exhaust pipe 32 is generated in the container 30.

By generating such air current in the container 30, the evaporation of the solvent contained in the resist solution 25 is promoted at the interface of the resist solution 25. The solidification of the resin components contained in the resist solution 25 progresses at this interface.

The gas expelling unit 31 sucks gas with, e.g., 50 kPa (kilopascals). The pressure at which the gas expelling unit 31 sucks gas may be settable as needed according to the solvent contained in the resist solution 25.

In the fourth stage after a predetermined set time elapses from the start of expelling gas, the gas expelling unit 31 stops expelling gas. In the lower left part of FIG. 10 are shown the nozzle 4 and the container 30 in the fourth stage. Because of air current during the set time, a solidified layer 26 having a predetermined thickness is formed inside the nozzle 4.

Where the gas expelling unit 31 sucks gas with, e.g., 50 kPa, the solidification of the resin components at the interface of the resist solution 25 starts when about five minutes elapse from the start of expelling gas. The set time is the time required to form the solidified layer 26 having a predetermined thickness starting from the start of expelling gas. The predetermined thickness of the solidified layer 26 is such a thickness that the solidified layer 26 can be easily detached by applying predetermined dispensing pressure of the resist solution 25. The predetermined dispensing pressure is, for example, 0.2 to 0.4 MPa.

The semiconductor manufacturing apparatus 1 makes the nozzle 4 wait in the waiting position while having the gas expelling unit 31 stop operating. By making air current in the container 30 stop, the solidified layer 26 maintains its thickness that it had when expelling gas was stopped.

Because the resist solution 25 remaining in the nozzle 4 is separated from air by the solidified layer 26, the evaporation of the solvent from the nozzle 4 is suppressed. Thus, the solidification of more of the resin components in the nozzle 4 is reduced. Further, the concentration of the resin components of the resist solution 25 remaining in the nozzle 4 is maintained. The semiconductor manufacturing apparatus 1 can suppress the occurrence of solidified objects except the solidified layer 26 during the time that it has the nozzle 4 wait.

As in the first embodiment, in the fifth stage, before moving the nozzle 4 from the waiting position to the supplying position when the nozzle 4 waiting ends, the dispensing unit 3 at the waiting position preliminarily dispenses the resist solution 25. The dispensing unit detaches the solidified layer 26 from the nozzle 4 by preliminary dispensing. The semiconductor manufacturing apparatus 1 repeats the operation of the dispensing unit 3 and the gas expelling unit 31 in the first to fifth stages.

The set time may be determined by any method such as performing a test to actually form the solidified layer 26 or performing a simulation of the formation of the solidified layer 26. The control device 33 sets the suction pressure of the gas expelling unit 31 and the set time based on data inputted by, e.g., operation of a user.

In the semiconductor manufacturing apparatus 1 of the present embodiment, by controlling the generation of air current from the nozzle 4 into the exhaust pipe 32, the solidified layer 26 of a desired uniform thickness can be formed in a short time. In the semiconductor manufacturing apparatus 1, the solidified layer 26 can be easily detached by the preliminary dispensing of the resist solution 25 at the waiting position.

The semiconductor manufacturing apparatus 1 can improve product yields to secure high productivity as in the first embodiment. Further, the semiconductor manufacturing apparatus 1 can greatly reduce the amount of the discarded resist solution.

Figure 11:
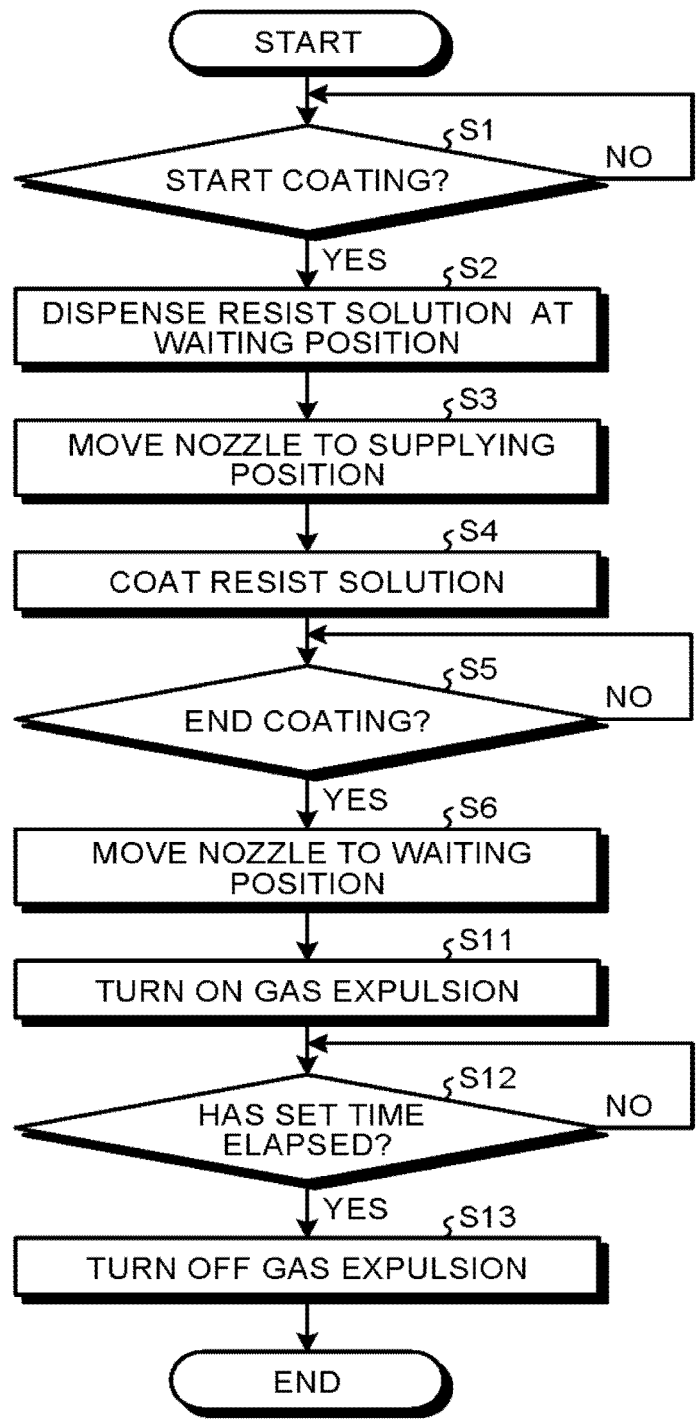
FIG. 11 is a flow chart for explaining the operation procedure of the semiconductor manufacturing apparatus of the second embodiment.

FIG. 11 is a flow chart for explaining the operation procedure of the semiconductor manufacturing apparatus 1. The operation procedure starts with the dispensing unit 3 being in the wait state. The nozzle 4 and the container 30 are in the state of the fourth stage described with reference to FIG. 10. The solidified layer 26 is formed inside the nozzle 4. The gas expelling unit 31 is made to stop expelling gas.

The procedure of steps S1 to S6 is the same as in the first embodiment. After moving the nozzle 4 to the waiting position finishes at step S6, the gas expulsion control unit 34 instructs the gas expelling unit 31 to start operating. The gas expelling unit 31 is put in an ON state to suck gas so as to start expelling gas (step S11). The nozzle 4 and the container 30 are in the state of the third stage described previously.

The gas expulsion control unit 34 determines whether a set time has elapsed since the gas expelling unit 31 started expelling gas (step S12). If the set time has not elapsed (No at step S12), the gas expulsion control unit 34 makes the gas expelling unit 31 continue expelling gas.

If the set time has elapsed (Yes at step S12), the gas expulsion control unit 34 instructs the gas expelling unit 31 to end operating. The gas expelling unit 31 is put in an OFF state to stop gas suction so as to end expelling gas (step S13). The nozzle 4 and the container 30 are made to return to the state of the fourth stage, with which the operation procedure starts.

By this means, the semiconductor manufacturing apparatus 1 finishes a series of operations including coating the resist solution onto the substrate 10. The semiconductor manufacturing apparatus keeps the dispensing unit 3 in the wait state until it is next instructed to start coating. The method of the second embodiment is appropriate for cases where the viscosity of the chemical solution is middle viscosity or above as in the first embodiment.

The control device 33 has the same hardware configuration as the control device 7 shown in FIG. 7. The pressure at which the gas expelling unit 31 sucks gas and the set time for which the gas expelling unit 31 is made to operate are inputted to the input unit 95 by a user's input operation. The CPU 91 controls the operation of the gas expelling unit 31 according to data inputted to the input unit 95. The display unit 94 may display data about the pressure and set time of the gas expelling unit 31 inputted to the input unit 95.

The semiconductor manufacturing apparatus 1 may include a mechanism other than the gas expelling unit 31 as one which promotes the evaporation of the solvent contained in the resist solution 25. The semiconductor manufacturing apparatus 1 may include, for example, an air supply means to supply air to the vicinity of the nozzle 4. The semiconductor manufacturing apparatus may promote the evaporation of the solvent by air current from the air supply means to make the solidification of the resin components progress.

The semiconductor manufacturing apparatus 1 may include the gas expelling unit 31 and the heater 11 of the first embodiment as a mechanism which promotes the evaporation of the solvent contained in the resist solution 25. The semiconductor manufacturing apparatus 1 may make the heater 11 operate before the preliminary dispensing of the resist solution 25 for detaching the solidified layer 26.

The gas expelling unit 31 may always perform gas expulsion to expel air including vaporized solvent as well as gas expulsion for forming the solidified layer 26. The gas expelling unit 31 greatly decreases suction pressure in this always-on gas expulsion as compared with the case of gas expulsion for forming the solidified layer 26. The semiconductor manufacturing apparatus 1 promotes the evaporation of the solvent by increasing the outlet flow rate in gas expulsion for forming the solidified layer 26, whereas it suppresses the evaporation of the solvent by decreasing the outlet flow rate in always-on gas expulsion.

According to the second embodiment, the control device 33 forms the solidified layer 26 of a desired uniform thickness by making the gas expelling unit 31 operate during the predetermined set time. The semiconductor manufacturing apparatus 1 can reduce contamination of the substrate 10 by solidified objects by increasing the cleanliness of the nozzle 4 at the time of resuming the dispensing of the chemical solution onto a substrate 10, so as to improve product yields. The semiconductor manufacturing apparatus 1 can reduce the amount of the chemical solution discarded at the waiting position. As in the first embodiment, the second embodiment also produces the effect of being able to realize high productivity and efficient use of the chemical solution.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:
   a nozzle to dispense a chemical solution onto a substrate;
   a control device that controls a mechanism which promotes evaporation of a solvent contained in the chemical solution remaining in the nozzle, thereby solidifying components contained in the remaining chemical solution to form a solidified layer in the nozzle; and
   a container placed at a position in which the nozzle is made to wait and into which a tip of the nozzle is inserted, wherein
   the mechanism includes a heater that supplies heat to the nozzle in the position in which the nozzle is made to wait,
   the heater is provided in the container, and
   the control device controls operation of the heater.

2. The substrate processing apparatus according to claim 1, wherein the control device makes the heater stop operating when a preset time has elapsed since the heater started operating.

3. The substrate processing apparatus according to claim 1, wherein the control device controls dispensing the chemical solution through the nozzle and detaches the solidified layer from the nozzle in the position in which the nozzle is made to wait, by preliminary dispensing of the chemical solution.

4. The substrate processing apparatus according to claim 3, wherein the control device controls the nozzle to move and, after the preliminary dispensing, moves the nozzle to a position over the substrate.

5. The substrate processing apparatus according to claim 3,
wherein the control device makes the heater operate before the preliminary dispensing.

6. The substrate processing apparatus according to claim 5, wherein the control device controls the nozzle to move and, before the heater is made to operate before the preliminary dispensing, moves the nozzle.

7. The substrate processing apparatus according to claim 6, wherein the control device makes the heater stop operating when a preset time has elapsed since the heater started operating, and
the control device controls the nozzle to move and, after the preliminary dispensing, moves the nozzle to a position over the substrate.

8. The substrate processing apparatus according to claim 1, wherein the mechanism includes a pump that generates air current around the nozzle in the position in which the nozzle is made to wait,
the pump expels gas in the container, and
the control device controls operation of the pump.

9. The substrate processing apparatus according to claim 8, wherein the control device makes the pump stop operating when a preset time has elapsed since the pump started operating.

10. The substrate processing apparatus according to claim 9, wherein the control device makes the heater stop operating when a preset time has elapsed since the heater started operating,
the control device controls dispensing the chemical solution through the nozzle and detaches the solidified layer from the nozzle in the position in which the nozzle is made to wait, by preliminary dispensing of the chemical solution,
the control device controls the nozzle to move and, after the preliminary dispensing, moves the nozzle to a position over the substrate,
the control device makes the heater operate before the preliminary dispensing, and
the control device controls the nozzle to move and, before the heater is made to operate before the preliminary dispensing, moves the nozzle.

11. A substrate processing apparatus comprising:
a nozzle to dispense a chemical solution onto a substrate;
a control device that controls a mechanism which promotes evaporation of a solvent contained in the chemical solution remaining in the nozzle, thereby solidifying components contained in the remaining chemical solution to form a solidified layer in the nozzle; and
a container placed at a position in which the nozzle is made to wait and into which a tip of the nozzle is inserted, wherein
the mechanism includes a pump that generates air current around the nozzle in the position in which the nozzle is made to wait,
the pump expels gas in the container, and
the control device controls operation of the pump.

12. The substrate processing apparatus according to claim 11, wherein the control device makes the pump stop operating when a preset time has elapsed since the pump started operating.

13. The substrate processing apparatus according to claim 11, wherein the control device controls dispensing the chemical solution through the nozzle and detaches the solidified layer from the nozzle in the position in which the nozzle is made to wait, by preliminary dispensing of the chemical solution.

14. The substrate processing apparatus according to claim 13, wherein the control device controls the nozzle to move and, after the preliminary dispensing, moves the nozzle to a position over the substrate.

15. The substrate processing apparatus according to claim 13, wherein the mechanism includes a heater that supplies heat to the nozzle in the position in which the nozzle is made to wait, and
the control device makes the heater operate before the preliminary dispensing.

16. The substrate processing apparatus according to claim 15, wherein the control device controls the nozzle to move and, before the heater is made to operate before the preliminary dispensing, moves the nozzle.

17. The substrate processing apparatus according to claim 16, wherein the control device makes the pump stop operating when a preset time has elapsed since the pump started operating, and
the control device controls the nozzle to move and, after the preliminary dispensing, moves the nozzle to a position over the substrate.

* * * * *